United States Patent
Yoshino

(10) Patent No.: US 10,410,711 B2
(45) Date of Patent: Sep. 10, 2019

(54) VOLATILE SEMICONDUCTOR MEMORY MANAGEMENT DEVICE

(71) Applicant: RISO KAGAKU CORPORATION, Tokyo (JP)

(72) Inventor: Yuji Yoshino, Ibaraki (JP)

(73) Assignee: RISO KAGAKU CORPORATION, Tokyo (JP)

( * ) Notice: Subject to any disclaimer, the term of this patent is extended or adjusted under 35 U.S.C. 154(b) by 0 days.

(21) Appl. No.: 15/785,842

(22) Filed: Oct. 17, 2017

(65) Prior Publication Data

US 2018/0144787 A1 May 24, 2018

(30) Foreign Application Priority Data

Nov. 22, 2016 (JP) ................................. 2016-226634

(51) Int. Cl.
*G11C 11/406* (2006.01)
*G06F 3/06* (2006.01)

(52) U.S. Cl.
CPC ...... *G11C 11/40611* (2013.01); *G06F 3/0604* (2013.01); *G06F 3/0659* (2013.01); *G06F 3/0673* (2013.01); *G11C 11/40618* (2013.01)

(58) Field of Classification Search
CPC ............. G11C 11/40611; G06F 3/0604; G06F 3/0659; G06F 3/0673
USPC ..................................................... 365/222
See application file for complete search history.

(56) References Cited

U.S. PATENT DOCUMENTS

| | | | |
|---|---|---|---|
| 7,590,021 B2 * | 9/2009 | Michalak | G11C 11/406 365/189.14 |
| 9,286,964 B2 * | 3/2016 | Halbert | G11C 11/40603 |
| 9,431,092 B2 * | 8/2016 | Lim | G11C 11/408 |
| 9,564,201 B2 * | 2/2017 | Halbert | G11C 11/40603 |
| 9,761,298 B2 * | 9/2017 | Halbert | G11C 11/40603 |
| 2006/0023545 A1 | 2/2006 | Ito et al. | |
| 2009/0027989 A1 * | 1/2009 | Michalak | G11C 11/406 365/222 |
| 2014/0016422 A1 | 1/2014 | Kim et al. | |
| 2014/0177370 A1 * | 6/2014 | Halbert | G11C 11/40603 365/222 |
| 2016/0055896 A1 * | 2/2016 | Lim | G11C 11/408 365/149 |

FOREIGN PATENT DOCUMENTS

| | | |
|---|---|---|
| JP | 2006-31860 A | 2/2006 |
| JP | 2014-22033 A | 2/2014 |

* cited by examiner

*Primary Examiner* — Xiaochun L Chen
(74) *Attorney, Agent, or Firm* — Greenblum & Bernstein, P.L.C.

(57) ABSTRACT

A management device for a volatile semiconductor memory includes: a request generator configured to output a refresh request requesting a refresh operation of a target cell in the volatile semiconductor memory; and a refresh operator configured to execute the refresh operation of the target cell requested in the refresh request outputted by the request generator. The request generator repeatedly outputs the refresh request for a same target cell in the volatile semiconductor memory intermittently at unequal intervals with each two successive intervals being different from each other.

5 Claims, 3 Drawing Sheets

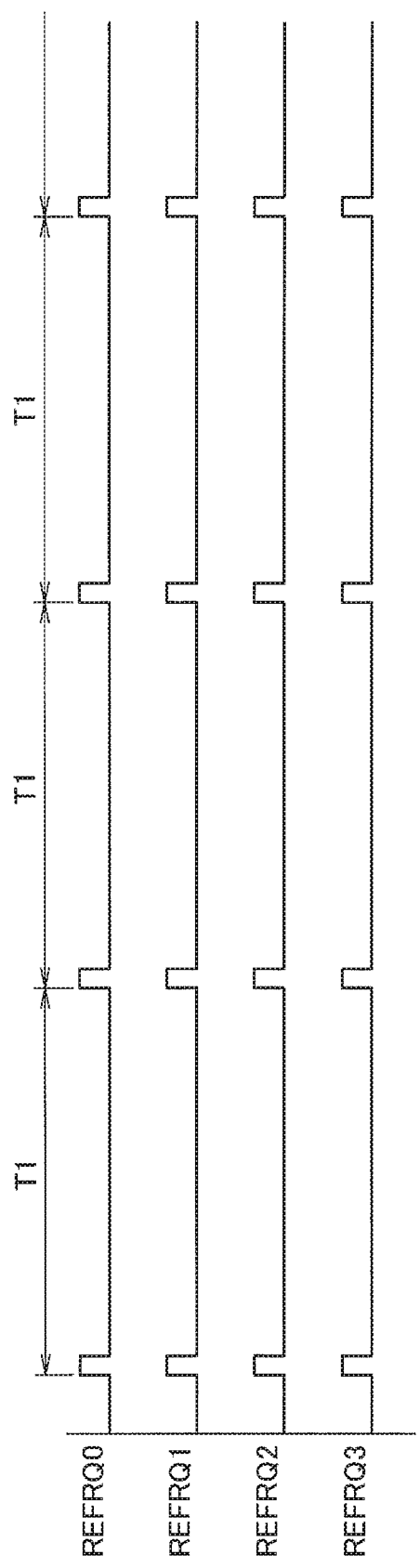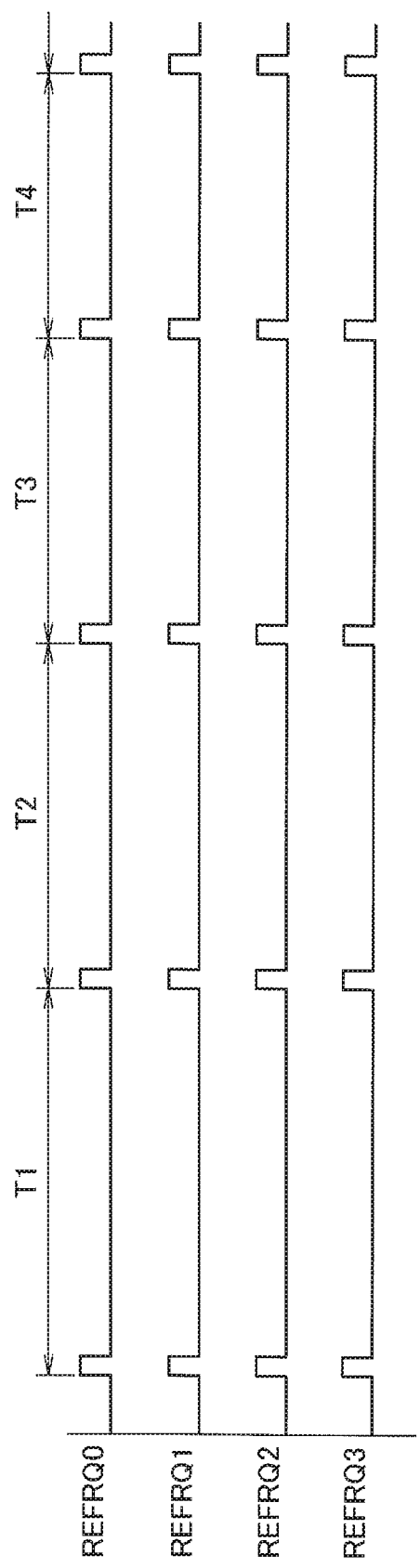

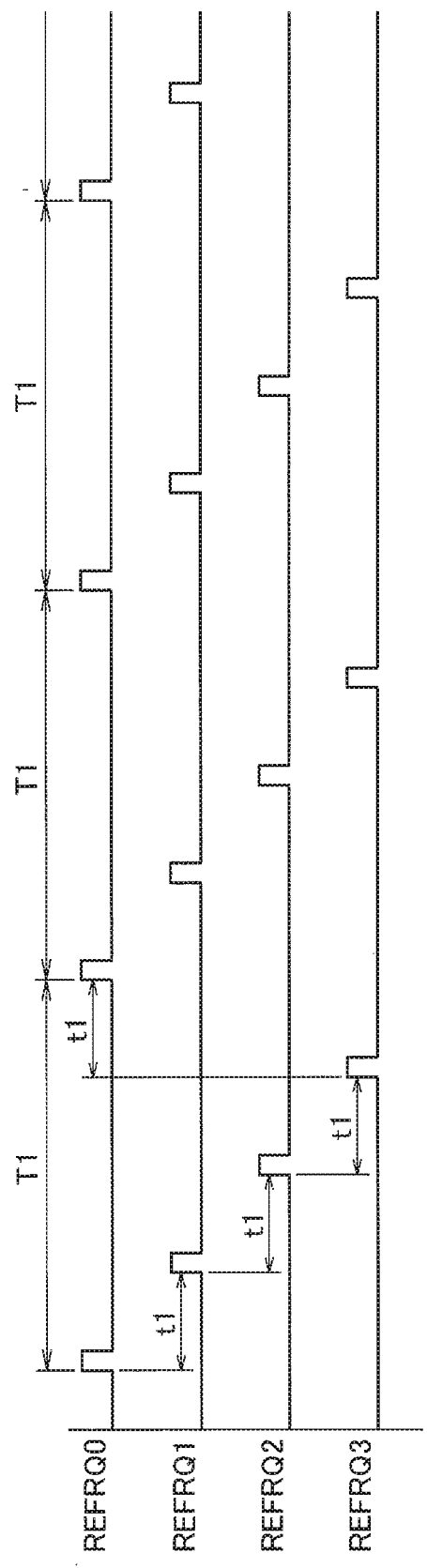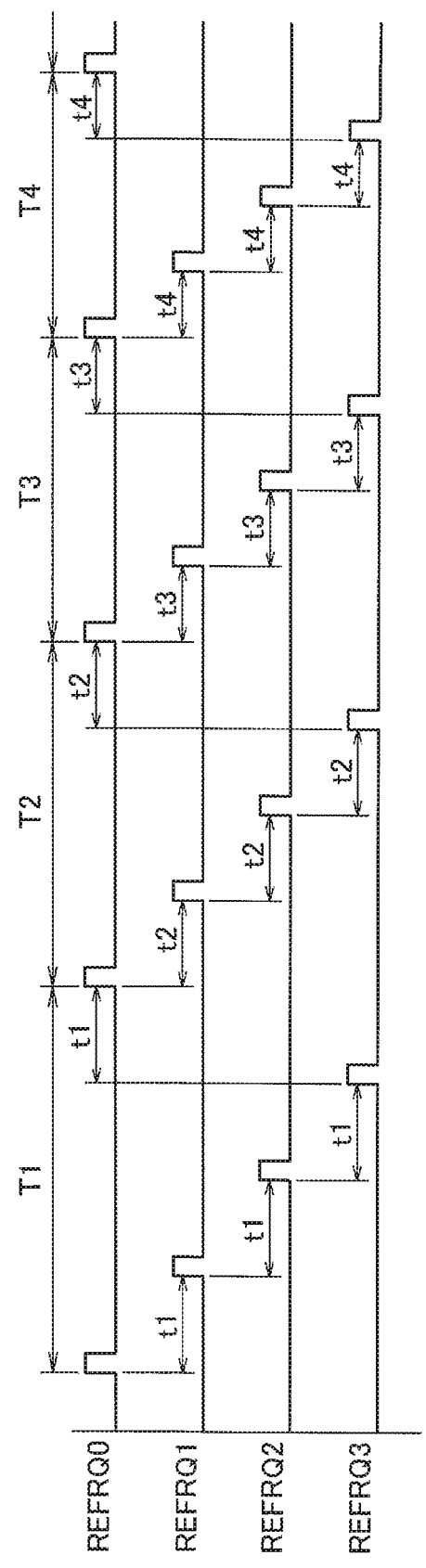

VOLATILE SEMICONDUCTOR MEMORY MANAGEMENT DEVICE

CROSS REFERENCE TO RELATED APPLICATION

This application is based upon and claims the benefit of priority from the prior Japanese Patent Application No. 2016-226634, filed on Nov. 22, 2016, the entire contents of which are incorporated herein by reference.

BACKGROUND

1. Technical Field

The disclosure relates to a management device of a volatile semiconductor memory for which a refresh operation is required to keep holding a stored content.

2. Related Art

As a volatile semiconductor memory, there is a semiconductor memory which dynamically stores data (DRAM). The DRAM has multiple cells each formed by combining a transistor and a capacitor. Each cell stores and holds data by using a charge accumulated in the capacitor.

Accordingly, in order to keep storing data in the DRAM, the DRAM has to repeatedly perform a refresh operation of storing the data again by accumulating a charge in the capacitor at certain intervals, before the charge accumulated in the capacitor leaks away and the stored data is erased.

Power consumption in each cell increases in the refresh operation of the DRAM. Japanese Patent Application Publications Nos. 2006-31860 and 2014-22033 propose techniques of suppressing the power consumption in the refresh operation as much as possible by adjusting a cycle of the refresh operation depending on a temperature condition around the cell and a condition of a charge accumulated in the cell.

SUMMARY

Suppressing the power consumption in the refresh operation of the DRAM is useful also to reduce the intensity of radiation noise generated due to a change in a current flowing through the DRAM. Moreover, since the radiation amount of the radiation noise which is an electromagnetic wave increases in proportion to the square of the frequency of the radiation noise, the refresh operation of the DRAM is preferably performed in a mode which minimizes a possibly of the refresh operation generating radiation noise with a high frequency.

The disclosure is directed to a semiconductor memory management device which can suppress, as much as possible, generation of radiation noise with a high frequency in a refresh operation performed by a volatile semiconductor memory such as a DRAM to keep holding a storage content.

A management device for a volatile semiconductor memory in accordance with some embodiments includes: a request generator configured to output a refresh request requesting a refresh operation of a target cell in the volatile semiconductor memory; and a refresh operator configured to execute the refresh operation of the target cell requested in the refresh request outputted by the request generator. The request generator repeatedly outputs the refresh request for a same target cell in the volatile semiconductor memory intermittently at unequal intervals with each two successive intervals being different from each other.

In the refresh operation, radiation noise is generated by a refresh current flowing through each target cell. When the refresh operation of the target cell is performed at fixed intervals, the radiation noise resonates at a fixed frequency expressed by an inverse of a refresh cycle.

Generally, the intervals of the refresh operation are in the order of one hundred-thousandth of a second (10 µs). Thus, when the radiation noise resonates at a fixed frequency, this fixed frequency is a high frequency in the order of 100 KHz. When the radiation noise being an electromagnetic wave resonates at a high frequency, the radiation amount of the radiation noise becomes significantly large, since the radiation amount is proportional to the square of the frequency.

In the configuration described above, since the intervals at which the request generator outputs the refresh request for the same target cell are unequal intervals, the radiation noise does not resonate at the fixed frequency. Hence, it is possible to minimize a possibility that the radiation noise resonates at a high frequency and a large amount of the radiation noise is radiated.

Thus, it is possible to suppress, as much as possible, the generation of the radiation noise with a high frequency in the refresh operation performed to hold a storage content of the volatile semiconductor memory such as a DRAM.

Each of the unequal intervals may have a time length in a range of an allowable cycle determined depending on a specification of the volatile semiconductor memory.

By maintaining the intervals at which the request generator outputs the refresh request for the same cell to be unequal intervals each having a length in the range of the allowable cycle determined depending on the specification of the semiconductor memory, the storage content of each target cell is surely kept irrespective of the condition (environmental condition, condition of the cell itself) of the target cell.

Accordingly, the configuration described above can achieve both of holding the contents stored in the cells by performing the refresh operation irrespective of the conditions of the cells and suppressing the generation of the radiation noise with a high frequency in the refresh operation.

The request generator may output the refresh request for each of memory banks of the volatile semiconductor memory, the refresh operator may execute the refresh operation of the target cell belonging to a memory bank requested in the refresh request, and the request generator may repeatedly output the refresh request for the same target cell belonging to a same memory bank of the volatile semiconductor memory intermittently at the unequal intervals, while outputting the refresh request for respective target cells belonging to the respective memory banks of the volatile semiconductor memory at timings shifted from each other among the memory banks.

In configuration described above, the output of the refresh request by the request generator and the refresh operation on the target cell by the refresh operator corresponding to this output are performed for each of the memory banks which are management units in management of the semiconductor memory by the management device.

Accordingly, it is possible to shift the timings of the refresh operations of the target cells for the respective memory banks and thereby distribute timings at which power consumption of the semiconductor memory increases due to the execution of the refresh operation and reduce the intensity of the radiation noise generated by the change in the current flowing through the semiconductor memory, compared to the case where the refresh operations are performed at the same timing for all target cells.

The request generator may include a CPU and the refresh operator may include a logic circuit.

BRIEF DESCRIPTION OF DRAWINGS

FIG. 3A illustrates the refresh requests outputted by the refresh request generating device in FIG. 1 and is a timing chart according to a comparative example and illustrating the case where the refresh requests for the cells in the memory banks are outputted simultaneously every device-based refresh cycle.

FIG. 3B illustrates the refresh requests outputted by the refresh request generating device in FIG. 1 and is a timing chart according to the embodiment of the present invention and illustrating the case where the refresh requests for the cells in the memory banks are outputted simultaneously at unequal intervals which are equal to or less than the device-based refresh cycle.

FIG. 4A illustrates the refresh requests outputted by the refresh request generating device in FIG. 1 and is a timing chart according to the comparative example and illustrating the case where the refresh requests for the cells in the memory banks are outputted at timings shifted from one another in a range of the device-based refresh cycle.

FIG. 4B illustrates the refresh requests outputted by the refresh request generating device in FIG. 1 and is a timing chart according to an embodiment of the present invention and illustrating the case where the refresh requests for the cells in the memory banks are outputted at timings shifted from one another in ranges of unequal intervals equal to or less than the device-based refresh cycle.

DETAILED DESCRIPTION

Figure 1:
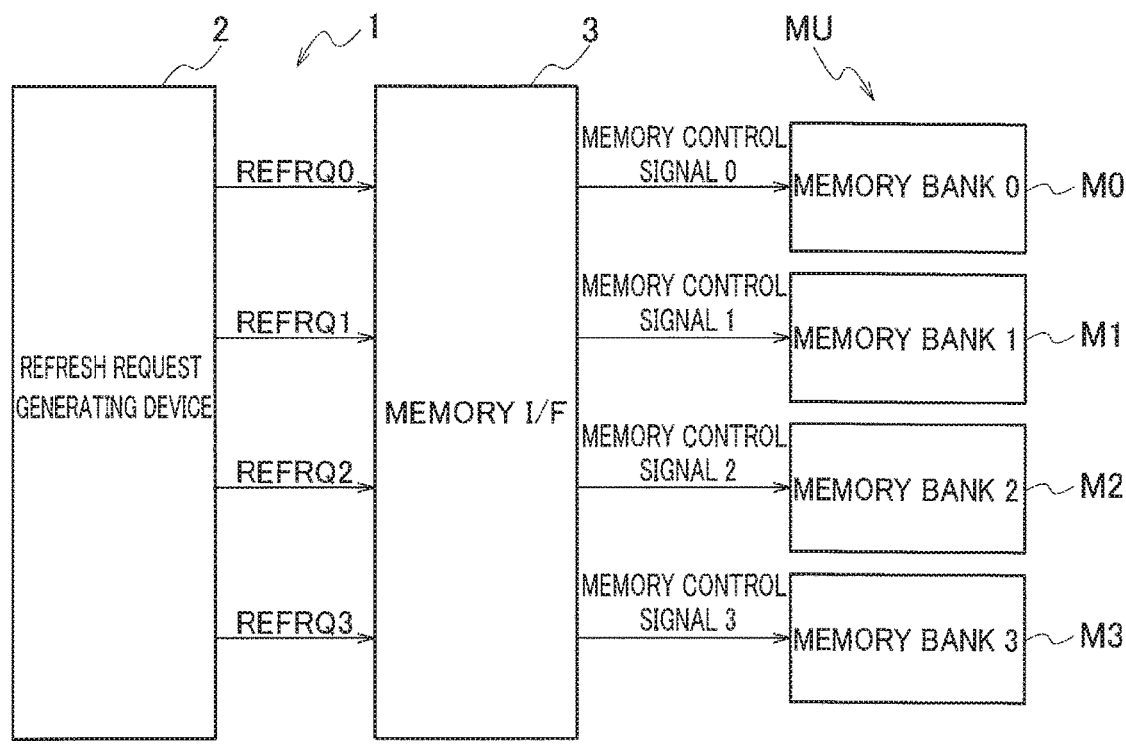
FIG. 1 is a block diagram illustrating a configuration of a management device of a semiconductor memory according to an embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Description will be hereinbelow provided for embodiments of the present invention by referring to the drawings. It should be noted that the same or similar parts and components throughout the drawings will be denoted by the same or similar reference signs, and that descriptions for such parts and components will be omitted or simplified. In addition, it should be noted that the drawings are schematic and therefore different from the actual ones.

FIG. 1 is a block diagram illustrating a configuration of a management device 1 of a semiconductor memory according to an embodiment of the present invention.

As illustrated in FIG. 1, the semiconductor memory management device 1 is a device which manages accesses to a memory unit MU.

The memory unit MU includes four memory banks (memory bank 0 to memory bank 3) M0 to M3. Each of the memory banks M0 to M3 includes many dynamic random access memories (DRAMs, not illustrated) which are volatile semiconductor memories. The DRAMs of each of the memory banks M0 to M3 are mounted on the same or multiple circuit boards (not illustrated). The semiconductor memory management device 1 manages the memory unit MU while dividing it into four units of the memory banks M0 to M3. Note that the number by which the memory unit MU is divided is not limited to four.

The semiconductor memory management device 1 includes a refresh request generating device 2 (request generator) and a memory interface (I/F) 3 (refresh operator).

The refresh request generating device 2 is a device which outputs refresh requests REFRQ0 to REFRQ3 being requests for refresh operations of cells, separately to the respective memory banks M0 to M3, and consists of a CPU, a storage unit including units such as a semiconductor memory, and the like. The storage unit stores address information of the memory unit MU, commands which cause a processor such as the CPU to perform control processing of operations of the refresh request generating device 2 described below when executed by the processor, and the like. Note that the refresh request generating device 2 may be configured to include no storage unit described above and instead receive similar data from the outside.

The refresh requests REFRQ0 to REFRQ3 outputted separately for the respective memory banks M0 to M3 by the refresh request generating device 2 each include ROW and COLUMN addresses of a cell in the DRAM and a row address strobe (RAS) and a column address strobe (CAS) which notify the memory I/F 3 of a timing to obtain these addresses.

The refresh request generating device 2 consists of, for example, a logic circuit and the like. The refresh request generating device 2 updates the ROW and COLUMN addresses in each of the refresh requests REFRQ0 to REFRQ3 to the addresses of the next cell from time to time. Moreover, the refresh request generating device 2 changes the signal levels of the RAS and the CAS in synchronization with the timing of the update.

The memory I/F 3 obtains, separately for each of the memory banks M0 to M3, the ROW address of the cell in the DRAM to be refreshed from a corresponding one of the refresh requests REFRQ0 to REFRQ3 based on the RAS, and obtains the COLUMN address of the cell in the DRAM to be refreshed from a corresponding one of the refresh requests REFRQ0 to REFRQ3 based on the CAS.

Then, the memory I/F 3 outputs memory control signals (memory control signal 0 to memory control signal 3) for executing the refresh operations on the cells associated with the ROW and COLUMN addresses obtained from the refresh requests REFRQ0 to REFRQ3, to the memory banks M0 to M3 to which these cells belong.

In the memory banks M0 to M3 having received the memory control signals (memory control signal 0 to memory control signal 3) from the memory I/F 3, the refresh operations of the cells associated with the ROW and COLUMN addresses obtained from the refresh requests REFRQ0 to REFRQ3 are executed according to the received memory control signals (memory control signal 0 to memory control signal 3).

In the flow described above, the refresh operations of the cells in the DRAMs belonging to the memory banks M0 to M3 are executed respectively for the memory banks M0 to M3.

In the refresh operation, there is performed processing of storing data again by accumulating a charge in a capacitor of the DRAM. Accordingly, during the refresh operation, it is impossible to access the DRAM from the outside to store data into the DRAM or read data stored in the DRAM. Thus, the cycle of the refresh operation may be set as long as possible.

Generally, a device-based refresh cycle is specified for the DRAM, depending on the specification of the DRAM. The device-based refresh cycle is a cycle recommended for surely performing the refresh operation of the DRAM before charges accumulated in capacitors of the DRAM leak away and data stored in the DRAM is erased.

Figure 2:
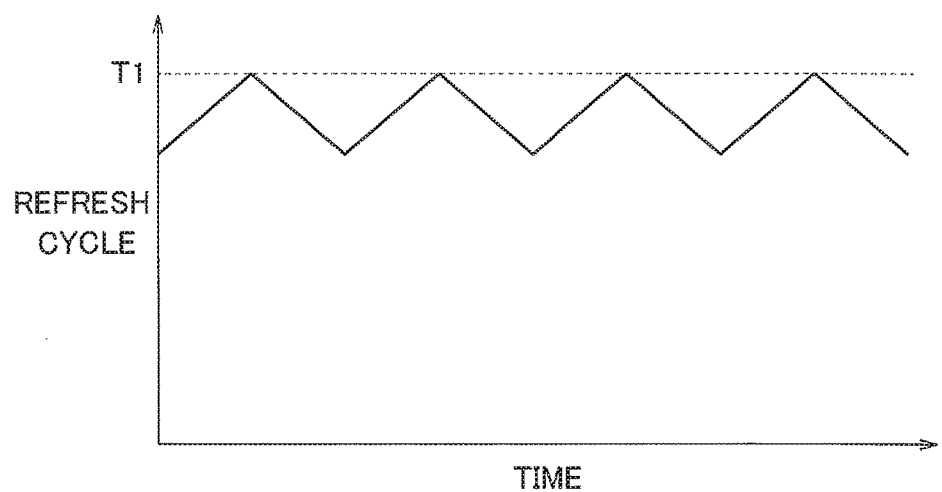
FIG. 2 is a graph illustrating a change in an interval of the refresh request for a cell over time, the refresh request outputted for each memory bank by a refresh request generating device in FIG. 1.

Thus, the frequency of the refresh operation may be reduced as much as possible by performing the refresh operation on each of the DRAMs of the memory banks M0 to M3 in the memory unit MU at the device-based refresh cycle illustrated by a dotted line in a graph of FIG. 2.

The refresh operation is executed at a cycle at which the refresh request generating device 2 of FIG. 1 outputs the refresh requests REFRQ0 to REFRQ3 for the respective memory banks M0 to M3. Accordingly, the frequency of the refresh operation can be reduced as much as possible by causing the refresh request generating device 2 to output the refresh requests REFRQ0 to REFRQ3 at the device-based refresh cycle.

In the refresh operation of each DRAM, a high current flows through the DRAM and radiation noise is generated in the DRAM by this high current. As illustrated in a timing chart of FIG. 3A, when the output cycle of the refresh requests REFRQ0 to REFRQ3 for the respective memory banks M0 to M3 is set to be fixed at the device-based refresh cycle T1, the radiation noise associated with the refresh operation is generated in the DRAMs of the memory banks M0 to M3 every refresh cycle T1. When the generation of the radiation noise is repeated at intervals of the refresh cycle T1, the radiation noise resonates at a fixed frequency expressed by an inverse of the refresh cycle T1.

Generally, the device-based refresh cycle T1 is in the order of one hundred-thousandth of a second (10 μs). Thus, when the radiation noise resonates at the fixed frequency, this fixed frequency is a high frequency in the order of 100 KHz. When the radiation noise being an electromagnetic wave resonates at the high frequency, the radiation amount of the radiation noise becomes significantly large, since the radiation amount is proportional to the square of the frequency.

In view of this, in the semiconductor memory management device 1, the refresh request generating device 2 changes the cycle at which the refresh requests REFRQ0 to REFRQ3 for the respective memory banks M0 to M3 are outputted, over time within a range equal to or less the device-based refresh cycle T1 as illustrated, for example, by a zigzag solid line in the graph of FIG. 2.

For example, in periods in which the output cycle of the refresh requests REFRQ0 to REFRQ3 is reduced over time in a period in which the output cycle of the refresh requests REFRQ0 to REFRQ3 is changed as illustrated by the solid line in the graph of FIG. 2, the refresh request generating device 2 sequentially reduces the output cycle of the refresh requests REFRQ0 to REFRQ3 from T1 to T2, to T3, to T4, and so on (T1>T2>T3>T4> . . . ) as illustrated in a timing chart of FIG. 3B.

As a result, each two chronologically-successive intervals (output cycles) at which the refresh request generating device 2 outputs the refresh requests REFRQ0 to REFRQ3 for the respective memory banks M0 to M3 are set to be unequal intervals different from each other. Thus, the radiation noise generated in each DRAM by the high current generated by the refresh operation and flowing through the DRAM does not resonate at the fixed frequency. Hence, it is possible to minimize a possibility that the radiation noise resonates at a high frequency and a large amount of the radiation noise is radiated.

By using the solid line in the graph of FIG. 2, description is given of the pattern by which the refresh request generating device 2 changes the cycle of outputting the refresh requests REFRQ0 to REFRQ3 for the memory banks M0 to M3 over time within the range equal to or less than the device-based refresh cycle T1 by repeatedly increasing and reducing the cycle at a fixed slope.

However, the pattern of changing the output cycle of the refresh requests REFRQ0 to REFRQ3 for the memory banks M0 to M3 over time is not limited to the zigzag pattern illustrated by the solid line in the graph of FIG. 2.

For example, the pattern may be such that the output cycle of the refresh requests REFRQ0 to REFRQ3 is gradually increased and, when the output cycle reaches the device-based refresh cycle T1 which is the maximum value in the change range, the output cycle is reduced to the minimum value in the change range and is gradually increased again in the same pattern.

Alternatively, the pattern may be such that the output cycle of the refresh requests REFRQ0 to REFRQ3 are gradually reduced and, when the output cycle reaches the minimum value in the change range, the output cycle is increased to the device-based refresh cycle T1 which is the maximum value in the change range and is gradually reduced again in the same pattern.

These patterns are not zigzag patterns like that illustrated by the solid line in the graph of FIG. 2, and are saw-tooth wave shaped patterns.

As described above, in the refresh operation of each DRAM, the high current flows through the DRAM and the radiation noise is generated. Accordingly, when the refresh requests REFRQ0 to REFRQ3 for the memory banks M0 to M3 are simultaneously outputted and the refresh operations on the DRAMs of the memory banks M0 to M3 are performed simultaneously, the radiation noise of the DRAMs is generated simultaneously in the memory banks M0 to M3 and the intensity of the radiation noise increases.

Thus, the timings at which the refresh request generating device 2 outputs the respective refresh requests REFRQ0 to REFRQ3 to the DRAMs in the memory banks M0 to M3 may be shifted from one another.

In such a case, it is rational to shift the output timings of the respective refresh requests REFRQ0 to REFRQ3 from one another by a cycle which is a quarter of the refresh cycle T1 (t1=(¼)×T1) as illustrated in a timing chart of FIG. 4A, such that no significant variation in the execution frequency of the refresh operation is caused by shifting the refresh timings of the DRAMs to vary among the memory banks M0 to M3.

When the output timings of the respective refresh requests REFRQ0 to REFRQ3 for the memory banks M0 to M3 are shifted from one another by the cycle t1 which is the quarter of the refresh cycle T1, the refresh operation of the DRAM is performed in one of the memory banks M0 to M3 every cycle t1, and the radiation noise associated with this refresh operation is generated.

When the radiation noise is generated in the memory banks M0 to M3 (memory unit MU) every cycle t1, the radiation noise resonates at the fixed frequency expressed by an inverse of the cycle t1. The resonance frequency at this time is a high frequency in the order of 1 MHz which is 10 times higher than the resonance frequency in the case where the radiation noise is generated every refresh cycle T1. Thus, the radiation amount of the radiation noise which is proportional to the square of the frequency is larger than the radiation amount of the radiation noise generated every refresh cycle T1.

In view of this, in the semiconductor memory management device 1, also when the refresh timings of the DRAMs are shifted from one another to vary among the memory banks M0 to M3, the refresh request generating device 2 changes each of the cycles at which the refresh requests REFRQ0 to REFRQ3 for the respective memory banks M0 to M3 are outputted, over time within the range equal to less than the device-based refresh cycle T1.

For example, in the periods in which the output cycles of the respective refresh requests REFRQ0 to REFRQ3 are reduced over time in the period in which the output cycles of the respective refresh requests REFRQ0 to REFRQ3 are changed as illustrated by the solid line in the graph of FIG. 2, the refresh request generating device 2 sequentially reduces the output cycles of the respective refresh requests REFRQ0 to REFRQ3 from T1 to T2, to T3, to T4, and so on (T1>T2>T3>T4> . . . ).

When the output cycles of the respective refresh requests REFRQ0 to REFRQ3 are set to the refresh cycle T1, the output timings of the respective refresh requests REFRQ0 to REFRQ3 are shifted from one another by the cycle which is the quarter of the refresh cycle T1 (t1=(¼)×T1) as illustrated in a timing chart of FIG. 4B, such that no significant variation in the execution frequency of the refresh operation is caused by shifting the refresh timings of the DRAMs to vary among the memory banks M0 to M3.

Similarly, when the output cycles of the respective refresh requests REFRQ0 to REFRQ3 are set to T2, the output timings of the respective refresh requests REFRQ0 to REFRQ3 are shifted from one another by a cycle which is a quarter of the cycle T2 (t2=(¼)×T2).

Moreover, when the output cycles of the respective refresh requests REFRQ0 to REFRQ3 are set to each of T3, T4, the output timings of the respective refresh requests REFRQ0 to REFRQ3 are shifted from one another by a cycle which is a quarter of the cycle T3, T4 (t3=(¼)×T3, t4=(¼)×T4).

In this case, after the refresh operation of the DRAMs is performed at the cycle t1 for all memory banks M0 to M3, the refresh operation is performed at the cycle of t2 for all memory banks M0 to M3, and then at each of the cycles t3, t4 for all memory banks M0 to M3. Accordingly, the cycle of the refresh operation of the DRAMs is any of the cycles t1 to t4 and is not fixed.

Specifically, each two chronologically-successive intervals at which the refresh request generating device 2 outputs one of the refresh requests REFRQ0 to REFRQ3 to the corresponding one of the memory banks M0 to M3 are set to be unequal intervals different from each other also in this case. Thus, the radiation noise generated in each DRAM by the high current generated by the refresh operation and flowing through the DRAM does not resonate at the fixed frequency. Hence, it is possible to minimize a possibility that the radiation noise resonates at a high frequency and a large amount of the radiation noise is radiated.

Moreover, since the refresh requests REFRQ0 to REFRQ3 for the respective memory banks M0 to M3 are outputted at the timings shifted from one another, the refresh operation is performed on the DRAMs in the memory banks M0 to M3 at shifted timings. Accordingly, it is possible to minimize a possibility that the radiation noise is generated simultaneously in the DRAMs of the memory banks M0 to M3 and the intensity of the radiation noise is increased.

In the embodiment described above, description is given of the case where the cycles at which the refresh request generating device 2 outputs the refresh requests REFRQ0 to REFRQ3 are reduced (or increased) in the same pattern as illustrated in, for example, the timing charts of FIG. 3B and FIG. 4B.

However, the cycles of the refresh requests REFRQ0 to REFRQ3 may be randomly reduced or increased in the range equal to or less than the device-based refresh cycle T1.

Moreover, the output cycles of the refresh requests REFRQ0 to REFRQ3 can be separately and randomly changed irrespective of whether the refresh timings of the DRAMs are shifted from one another to vary among the respective memory banks M0 to M3, provided that no significant variation in the execution frequency of the refresh operation occurs.

Moreover, the present invention can be widely applied to devices configured to manage a volatile semiconductor memory for which a refresh operation needs to be repeatedly executed to keep holding a storage content.

Embodiments of the present invention have been described above. However, the invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

Moreover, the effects described in the embodiments of the present invention are only a list of optimum effects achieved by the present invention. Hence, the effects of the present invention are not limited to those described in the embodiment of the present invention.

What is claimed is:

1. A management device for a volatile semiconductor memory, the management device comprising:
    a request generator configured to output a plurality of refresh requests requesting a plurality of refresh operations of a plurality of target cells in the volatile semiconductor memory; and
    a refresh operator configured to execute the plurality of refresh operations of the plurality of target cells requested in the plurality of refresh requests output by the request generator, wherein
    the plurality of target cells is included in a plurality of memory banks,
    the plurality of refresh requests is sequentially output to the plurality of memory banks in a plurality of consecutive output cycles,
    a single refresh request of the plurality of refresh requests is output to each of the plurality of memory banks in each of the plurality of consecutive output cycles,
    each of the plurality of consecutive output cycles includes a refresh cycle,
    the refresh cycle is different for each two chronologically-successive output cycles of the plurality of consecutive output cycles, and
    for each two chronologically-successive output cycles, the request generator sequentially outputs the single refresh request to each of the plurality of memory banks at unequal intervals.

2. The management device for the volatile semiconductor memory according to claim 1, wherein each of the unequal intervals has a time length in a range of an allowable cycle determined depending on a specification of the volatile semiconductor memory.

3. The management device for the volatile semiconductor memory according to claim 1, wherein
the request generator outputs the single refresh request to a same memory bank of the volatile semiconductor memory intermittently during the plurality of consecutive output cycles at second unequal intervals, while outputting the single refresh request to each of the plurality of memory banks of the volatile semiconductor memory in each of the plurality of consecutive output cycles at timings shifted from each other among the plurality of memory banks.

4. The management device of the volatile semiconductor memory according to claim 1, wherein
the request generator comprises a CPU, and
the refresh operator comprises a logic circuit.

5. The management device of the volatile semiconductor memory according to claim 1, wherein one refresh operation is always performed in response to one refresh request.

* * * * *